(12) United States Patent
Knierim et al.

(10) Patent No.: US 10,094,868 B2
(45) Date of Patent: Oct. 9, 2018

(54) TEST AND MEASUREMENT INSTRUMENT HAVING ADVANCED TRIGGERING CAPABILITY

(71) Applicant: Tektronix, Inc., Beaverton, OR (US)

(72) Inventors: Daniel G. Knierim, Beaverton, OR (US); David L. Kelly, Portland, OR (US); Jed H. Andrews, Aloha, OR (US); Michael A. Martin, Lake Oswego, OR (US); Patrick A. Smith, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 533 days.

(21) Appl. No.: 14/553,405

(22) Filed: Nov. 25, 2014

(65) Prior Publication Data
US 2015/0293170 A1    Oct. 15, 2015

Related U.S. Application Data

(60) Provisional application No. 61/978,572, filed on Apr. 11, 2014.

(51) Int. Cl.
    *G06F 19/00* (2018.01)
    *G01R 31/28* (2006.01)
    *G01R 13/02* (2006.01)

(52) U.S. Cl.
    CPC ......... *G01R 31/28* (2013.01); *G01R 13/0254* (2013.01)

(58) Field of Classification Search
    CPC ...................... G01R 31/28; G01R 13/0254

USPC ........................................... 702/124
See application file for complete search history.

(56) References Cited

U.S. PATENT DOCUMENTS

| 5,675,729 | A | * | 10/1997 | Mehring | G06F 11/3409 |
|---|---|---|---|---|---|
| | | | | | 714/37 |
| 7,191,079 | B2 | | 3/2007 | Smith et al. | |
| 7,346,813 | B1 | * | 3/2008 | Schulz | G06F 11/2268 |
| | | | | | 714/26 |
| 7,398,437 | B2 | | 7/2008 | Mastro et al. | |
| 8,479,069 | B2 | | 7/2013 | Miller et al. | |
| 8,525,548 | B2 | | 9/2013 | Hutchings et al. | |
| 2005/0225310 | A1 | * | 10/2005 | Smith | G01R 13/32 |
| | | | | | 324/121 R |
| 2014/0095098 | A1 | * | 4/2014 | Niles | G01R 13/0263 |
| | | | | | 702/85 |

* cited by examiner

*Primary Examiner* — Fernando Hidalgo
(74) *Attorney, Agent, or Firm* — Marger Johnson; Andrew I. Harrington

(57) ABSTRACT

A test and measurement instrument, including an input configured to receive a signal-under-test, a user input configured to accept a first trigger event and a second trigger event from a user, a first trigger decoder configured to trigger on an occurrence of the first trigger event and generate a first trigger signal, a second trigger decoder configured to trigger on an occurrence of the second trigger event occurring after the first trigger event and generate a second trigger signal, and an acquisition system configured to acquire the signal-under-test in response to the first trigger signal and store the acquired signal-under-test based on whether the second trigger signal validates or invalidates the first trigger signal.

20 Claims, 9 Drawing Sheets

TEST AND MEASUREMENT INSTRUMENT HAVING ADVANCED TRIGGERING CAPABILITY

PRIORITY

This application claims priority to U.S. Provisional Application No. 61/978,572 filed Apr. 11, 2014, which is hereby incorporated by reference in its entirety.

TECHNICAL FIELD

This disclosure relates generally to the field of triggered test and measurement instruments, and, more specifically, to an advanced trigger system for a modern test and measurement instrument.

BACKGROUND

An oscilloscope is an electronics test and measurement instrument used by an engineer to acquire and display a waveform of interest from a particular test point of a circuit under test. The earliest oscilloscopes had no triggering capability, and as a result were unable to produce a stable display of the waveform of interest. Triggering circuitry was added to early analog oscilloscopes to provide stability to the display, by always starting the drawing of the waveform on the oscilloscope screen in response to detection of a trigger event. Thus, occurrence of the trigger event would cause the waveform to be displayed in a stable fashion at the same place on the screen.

Modern real time digital storage oscilloscopes (DSOs) also employ trigger systems to achieve stable displays, but they operate in a substantially different way. A DSO continuously acquires sample points and stores them in a circularly arranged acquisition memory. That is, when the last memory location in the acquisition memory is filled, a memory pointer is reset to the top of the acquisition memory and the samples continue to be acquired and stored. The samples collected before receipt of a trigger event are known as pre-trigger data. The detection of a trigger event sets the "zero" time position for the acquisition, and following samples collected are known as post-trigger data. Another trigger will not be accepted until the acquisition of the post-trigger data is complete.

Stated another way, a trigger system employs technology that enables engineers to capture (trigger on) signals relative to a specific event in time. The technology is typically used for troubleshooting (i.e., debugging) high-speed digital circuits to identify events that cause improper operation of those circuits. A desired trigger event can be a result of unexpected analog or digital operation that occurs at a single point in time (an anomaly) or as a result of a logic sequence.

Modern DSOs have been enabled to trigger on a large variety of events. The most commonly selected trigger is Edge Trigger, which examines the signal under test for an occurrence of either positive-going or negative-going vertical transition. In addition, a list of advanced triggers known in the art comprises: Glitch, runt, pulse width, level, pattern, state, setup & hold violation, logic-qualified, time-out, predetermined window, a predetermined period, time-qualified transition, time-qualified pattern, and serial data triggering.

Sequential triggering is also known in the art and is useful when it is necessary to trigger the instrument from two different events. In known sequential triggering systems, a main (or A) trigger event is selected from a menu of possible trigger events, and a delayed (or B) trigger event is engaged. In sequential triggering the A-trigger arms the oscilloscope to trigger upon receipt of the B-trigger.

A form of sequential triggering is also known in the logic analyzer prior art. However, logic analyzer triggering is clock-based, not continuous. That is, a logic analyzer samples a trigger event with its sampling clock. In an oscilloscope, the trigger event is applied in analog form to a trigger comparator; there is no clock involved. A continuous-type trigger is required in an oscilloscope in order for the oscilloscope to precisely locate the trigger point in time with respect to the received data. Moreover, logic analyzers do not respond to "analog" triggers (i.e., those that require comparison to at least two thresholds, such as, rise time, fall time, window, runt, etc.). Finally, logic analyzers do not employ coupling modes other than DC coupling.

Unfortunately, even a DSO with all of the above-recited triggering functions cannot trigger on certain compound events as found in today's ever more complex circuitry. U.S. Pat. No. 7,191,079, incorporated herein by reference in its entirety, discusses the concept of Pinpoint™ triggering which extends the concept of sequence triggering to allow multiple choices for the first (or "A") event type to be recognized in the sequence, multiple choices for the second (or "B") event type to be recognized in the sequence and inclusion of a third (or "C") event and/or a timeout from the A event to reset the sequence. In all of these cases, however, either a single A event (no sequence involved) or a B event properly sequenced after an A event became the trigger event (the time reference for the captured waveform). Stated another way, the A-trigger arms the oscilloscope to trigger upon receipt of the B-trigger event.

The disclosed technology addresses these limitations of the prior art.

SUMMARY

A test and measurement instrument according to embodiments of the disclosed technology includes an input configured to receive a signal-under-test, a user input configured to accept a first trigger event and a second trigger event from a user, a first trigger decoder configured to trigger on an occurrence of the first trigger event and generate a first trigger signal, a second trigger decoder configured to trigger on an occurrence of the second trigger event occurring after the first trigger event and generate a second trigger signal, and an acquisition system configured to acquire the signal-under-test in response to the first trigger signal and store the acquired signal-under-test based on whether the second trigger signal is generated by the second trigger decoder.

Other embodiments of the disclosed technology include a method for triggering an acquisition of a signal-under-test, including receiving a signal-under-test, receiving a first trigger event and a second trigger event, triggering on an occurrence of the first trigger event and generating a first trigger signal, triggering on an occurrence of the second trigger event occurring after the first trigger event and generating a second trigger signal, and acquiring the signal-under-test in response to the first trigger signal and storing the acquired signal-under-test based on whether the second trigger signal is generated.

DETAILED DESCRIPTION

Figure 1:
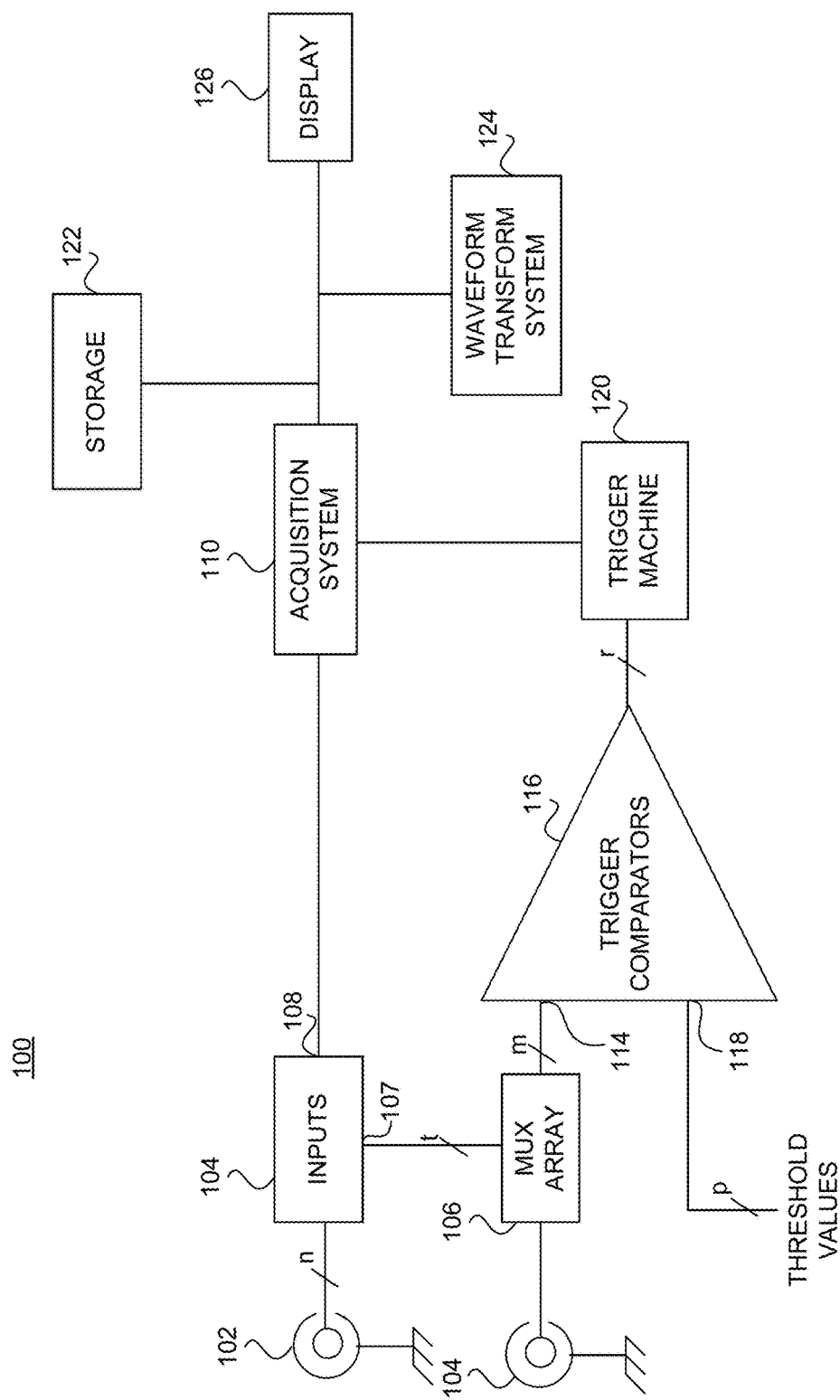
FIG. 1 is a block diagram of the circuitry of a test and measurement instrument according to embodiments of the disclosed technology.

In the drawings, which are not necessarily to scale, like or corresponding elements of the disclosed systems and methods are denoted by the same reference numerals.

FIG. 1 shows a high-level block diagram of a test and measurement instrument 100 according to the subject invention. Test and measurement instrument 100 includes an input 102 for receiving a signal under test (SUT) from a user's circuit. Although shown as a single connector for simplicity, input 102 actually comprises a number n of input channels (where n is any reasonable number, but usually 1, 2, 4 or 8). The n signal lines are applied to an input block 104 representing the "front end" of the test and measurement instrument 100 including, buffer amplifiers, attenuation circuitry, and the like for conditioning the input signal. Input block 104 has a first output 107 for providing signals over a number t of lines to a first input of a Multiplexer (Mux) Array unit 106, and a second output terminal 108 for providing the conditioned input signal to an Acquisition System 110 wherein signal samples are taken repeatedly, are converted to digital form, and are stored in a circular acquisition memory within Acquisition System 110. Mux Array 106 has a second input coupled to an External Trigger-in connector 104 for receiving an externally applied trigger signal, if any. Mux Array 106 applies a number m of signals to a first input 114 of Trigger Comparators unit 116.

Trigger Comparators unit 116 has a second input 118 coupled to receive a number p of threshold values from a controller (not shown for simplicity). Trigger Comparators unit 116 is programmable by a user to detect numerous different trigger conditions, as will be explained in detail below. Trigger Comparators unit 116 generates output signals upon detection of predetermined trigger conditions, and couples the output signals over a number r of lines to an input of a Trigger Machine 120. In response, Trigger Machine 120 provides a signal to Acquisition System 110 to associate a particular portion of the input signal with the triggering event. Advantageously, Trigger Comparators unit 116 also includes various coupling arrangements (i.e., DC coupling, AC coupling, High Frequency Reject, etc.) that may be selected by a user via a front panel control or menu selection. Trigger Comparators unit 116 also includes some slope control.

In response to the detection of a trigger event, Acquisition Circuit 110 continues to acquire post-trigger data for some predetermined number of samples, then stops. At this point, the acquired data may be moved to a Storage Memory 122 and may be processed by a Waveform Transform System 124 for display on a Display 126.

Figure 2:
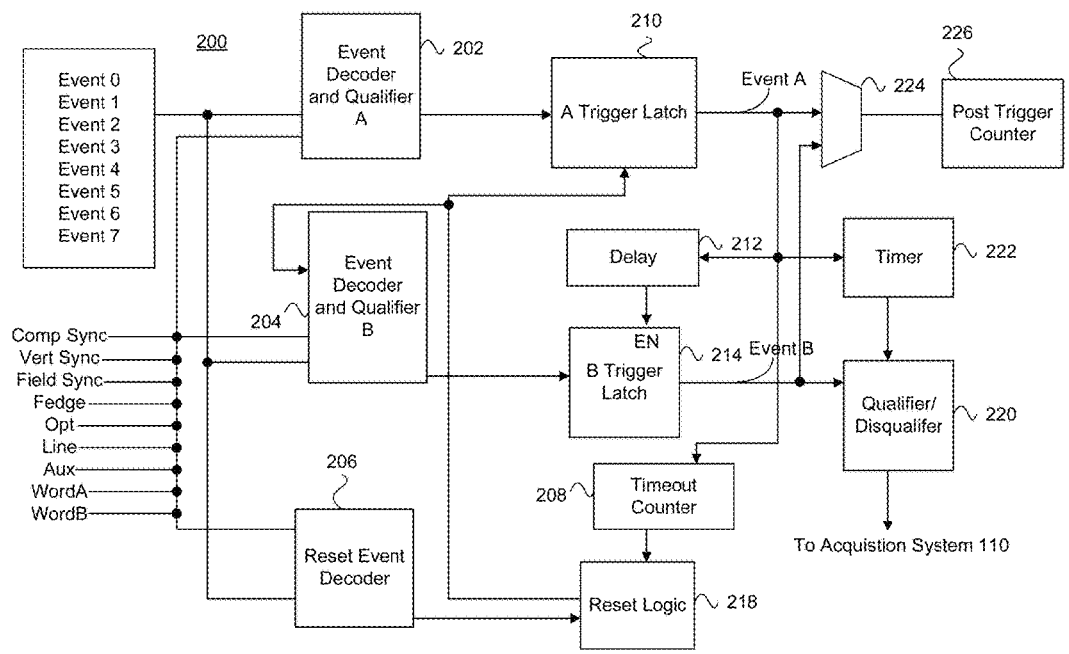
FIG. 2 is a block diagram for trigger circuitry of embodiments of the disclosed technology.

FIG. 2 shows a simplified illustration of an Event Decoder portion 200 of Trigger Machine 120 of FIG. 1. Note that Event Decoder 200 includes an Event Decoder and Qualifier A 202, an Event Decoder and Qualifier B 204, a Reset Event Decoder 206, and a Timeout Counter 208. The output signal of Event Decoder and Qualifier A 202 is latched by an A Trigger Latch 210 and applied via a programmable delay element 212 to an Enable (EN) input on a B Trigger Latch 214. The output signal of Event Decoder and Qualifier B 204 is latched by B Trigger Latch 214. It is important to note that a Timeout Counter 208 begins timing when A Trigger Latch 210 produces a "True" logic level output signal. A Reset Logic Block 218 can be programmed to produce an output signal if it receives a signal from Reset Event Decoder 206, or if it receives an End-of-time signal from Timeout Counter 208 or a more complex combination of a B-Event and Reset Event Decoder outputs. In any of these cases, the output signal from Reset Logic Block 218 is applied to A-Trigger Latch 210 to reset it, and thereby to prevent Event Decoder and Qualifier B 204, and its associated B Trigger Latch 214, from looking for its trigger event. It should be understood that Reset Logic Block 218 can also be programmed to not reset A-Trigger Latch 210. Moreover, the End-of-time signal itself may be used as a trigger event.

Note that each of Event Decoder and Qualifier A 202, Event Decoder and Qualifier B 204, and Reset Event Decoder 206 include source and slope control inputs that are controlled by a controller (not shown) in response to user selection via front panel controls, or a menu.

In one embodiment, Event 0 through Event 3 result from comparing input signals from channels 1-4 to a predetermined set of four trigger levels in a first group. Event 4 through Event 7 result from comparing input signals from channels 1-4 to a predetermined set of four trigger levels in a second group. Other trigger sources, collectively referred to as "auxiliary sources", are shown in FIG. 2 and include three video signal triggers (COMP SYNC, VERT SYNC, and FIELD SYNC). Yet another auxiliary trigger source is FEDGE (i.e. fast edge, a calibration signal from an external trigger source). A further auxiliary trigger source is OPT (option). Still another auxiliary trigger source is AUX (an external trigger-in terminal). Finally, the outputs of two word recognizers (WORD A and WORD B) may be used to trigger the oscilloscope.

The Event Decoder portion 200 also includes a B Event Qualifer/Disqualifier 220, a timer 222, a multiplexer 224 and a post trigger counter 226. Depending on the selected mode of the trigger functionality of the test and measurement instrument, a B Event may qualify or disqualify the A Event that resulted in an acquisition of the signal-under-test.

Timer 222 begins timing after an A Event for a specified period of time, which may be set by the user interface discussed herein. The output from the B Trigger Latch 214 can be used to start the post trigger counter during a normal A-B sequence trigger, or it can be used as an input into the B Event Qualifier/Disqualifier 220. The output from the B Trigger Latch 214 and the input from the Timer 222 can be used by the Qualifier/Disqualifier 220 to validate or invalidate the A Trigger. The Qualifier/Disqualifier 220 can alter the information sent by the Trigger Machine 120 to the Acquisition System 110 in FIG. 1 to discard the acquisition triggered by Event A.

As discussed in more detail below, an acquisition based on the A Event will either be kept or discarded based on the presence or absence of the B Event before the Timer 222 outputs an end-of-qualification-period signal. Although not shown, the trigger circuitry 200 may also have a C Event Decoder and Qualifier with a C Trigger Latch. A C Event is sent to the Qualifier/Disqualifier 220 and may act as an end-of-qualification-period signal, similar to the Timer 222 output. That is, the acquisition started from the A Event will be accepted or rejected based on the presence or absence of the B Event before the end-of-qualification-period signal from the C Event or Timer 222.

Figure 3:
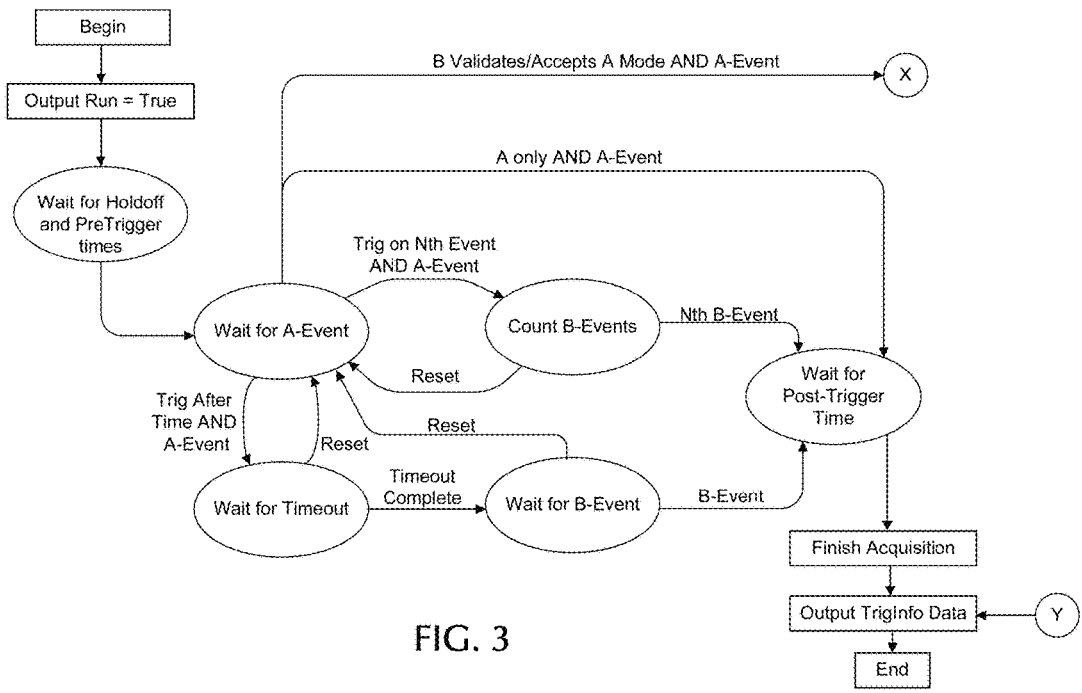
FIGS. 3 and 4 are state machine diagrams according to embodiments of the disclosed technology.

The apparatus of the subject invention may be described in terms of a state machine, as shown in FIG. 3. The state machine is entered at the upper left and waits for the A-Event to occur. If A-only is selected and A-Event occurs then the state machine advances to the Wait for Post-Trigger Time state, and exits thereafter. If Trig on Nth Event is selected and A-Event occurs, then the state machine advances to the count B-events state and remains there until the predetermined number of B-events has occurred, or until a reset has occurred. Upon achieving the required number of B-events, the state machine advances to the Wait for Post-Trigger Time state, and exits thereafter. If a reset occurred, then the state machine returns to the Wait for A-Event state. If Trig After Time is selected and A-Event occurs, then the state machine advances to the Wait for Timeout state for the required period (or until a reset is received). If the required period has elapsed, then the state machine advances to the Wait for B-Event state. If a reset occurred, then the state machine returns to the Wait for A-Event state. The state machine will remain in the Wait for B-Event state until the B-Event occurs or until a reset is received. If the B-Event occurs, then the state machine advances to the Wait for Post-Trigger Time state, and exits thereafter. If a reset occurred, then the state machine returns to the Wait for A-Event state.

Figure 4:
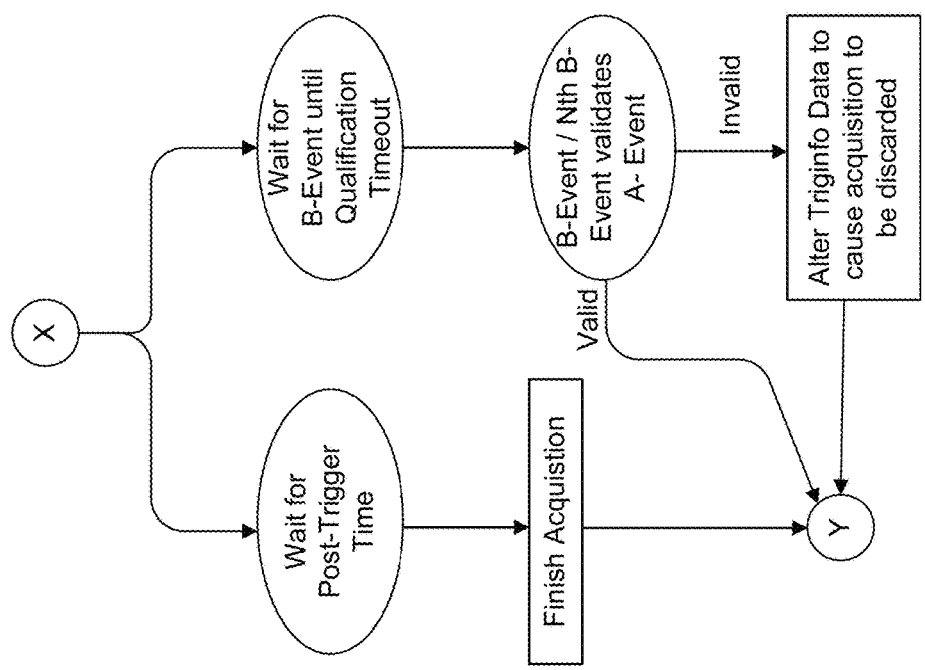

An example of an advanced trigger in accordance with the disclosed technology is as follows. If B Validates/Accepts A mode is selected and A-Event occurs, then the state machine advances to X, which is shown in FIG. 4. The state machine advances to the Wait for Post-Trigger Time state, and also watches for B-Events while waiting for end-of-qualification-period signal (Timeout) from the Timer 222. The post trigger timer will run to completion and finish the acquisition. In parallel the state machine will watch for the B-Events until the Timer 222 expires. Based on a user configuration via a menu selection and an occurrence or lack of a B-Event(s) within the qualifying period the state machine will either exit directly to Y leaving the acquisition valid or it will alter the trigger information sent to the acquisition system to invalidate and discard the acquisition. If the presence or absence of the B Event(s) validates the A Event, then the acquisition from the A Event is transferred to storage 122 and may be processed through the Waveform Transform System 124 and displayed on display 126. If the presence or absence of the B Event(s) invalidates the A Event, then the acquisition from the A Event is discarded. In either case a new acquisition cycle then may be started.

Stated another way, in the disclosed technology, the trigger sequence can be set up to have the A Event validated by the B Event or the A Event invalidated by the B Event. That is, if the A Event is validated by the B Event, then the acquisition remains valid only if the B Event occurs after the A Event and before the end-of-qualification period from the timer or C event decoder. If the A Event is invalidated by the B Event, then the acquisition remains valid only if the B Event does not occur after the A Event and before the end-of-qualification period from the timer or C event decoder. If the acquisition is not invalidated, the acquisition of the signal-under-test started after the A Event trigger is transferred to storage 122.

A hardware solution, as discussed herein, to validate or invalidate A trigger events provides much faster re-arm times to begin searching for the next A Event, without requiring use of additional digitizer resources or acquisition memory, as required by software-based post-processing techniques. In typical use cases, these hardware advantages may represent two to three orders of magnitude improvement over software post-processing.

The advanced trigger acquisition modes described herein may be implemented using existing Pinpoint™ trigger hardware; that is, a field programmable gate array (FPGA) and a high-speed trigger logic chip. The high-speed trigger logic chip is programmed as it is for the "A then B" sequence mode, discussed above, except that the A trigger is now used to stop the Acquisition System 110 and flag a low-speed trigger logic chip, a section of the FPGA, to read the A time interpolator. A new timeout counter within the FPGA, timer 222, begins and waits for the reset time period and polls the high-speed trigger logic chip B time interpolator to determine if a B event has or has not occurred after the A event and before the reset time. If the presence or absence, depending on the trigger mode, of the B event has validated the A event, the FPGA then passes the A time interpolator data to the Acquisition System 110 to complete the acquisition cycle. The high-speed trigger logic chip and the low-speed trigger logic chip may be application-specific integrated circuits and work in conjunction with other trigger event generation chips.

However, if the A Event has been invalidated, the FPGA signals the Acquisition System 110 to reject the acquisition and start a new one.

The hardware disclosed above and discussed in U.S. Pat. No. 7,191,079, allows for further enhancements of the advanced trigger system discussed herein. For example, by passing a trigger comparator output to the FPGA through a serial trigger channel and programming the FPGA, various C Events can be recognized as a reset condition, rather than or in addition to the timer. Alternatively, a second occurrence of an A Event may simultaneously reset a sequence and start another sequence.

The advanced trigger functionality discussed herein may be used with any of the test and measurement's acquisition modes. However, the advanced triggers discussed above are particularly well suited to the FastAcq mode provided in oscilloscopes manufactured by Tektronix. In the FastAcq mode, the acquisition rate is of prime importance. The FastAcq mode enables a quick overlay of many captured records, e.g., up to 400,000 acquisitions per second. This overlay may be used directly for visual identification of patterns, or the data may be further post-processed after a large number of acquisitions to determine waveform parameters, e.g., average and/or standard deviation of the waveform at each point in time.

Figure 5:
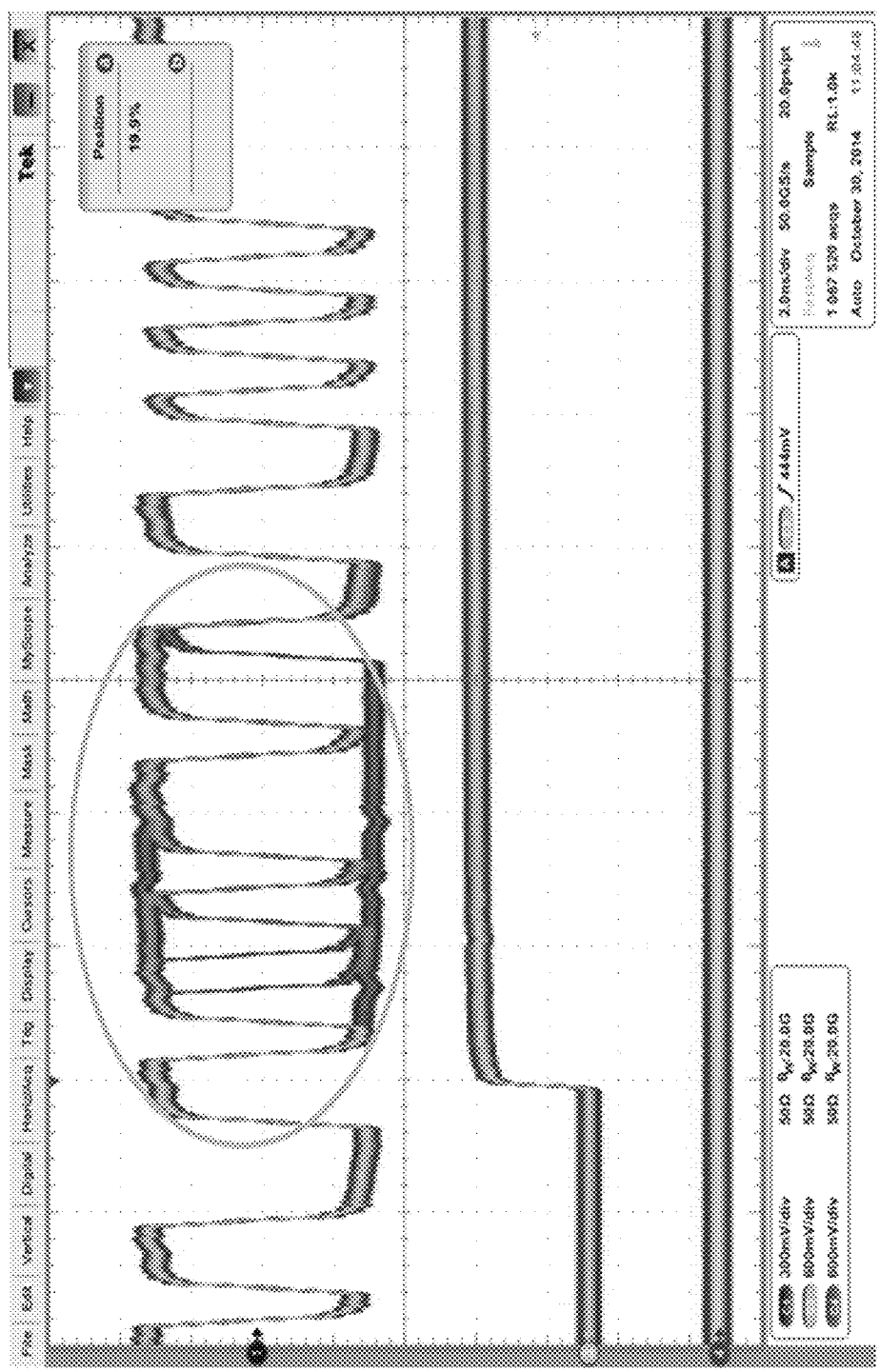
FIGS. 5-9 are example screenshots of a test and measurement instrument implementing the disclosed technology.

FIG. 5 depicts a screenshot of a signal under test in which the useful information to be captured on channel 1 is located in time by a reference signal on channel 3. A qualifying signal on channel 4 may occur much later to indicate whether the channel 1 data is valid. Simple edge trigger on channel 3 causes an overlay of invalid and valid data on channel 1. The goal is to be able to trigger the scope to acquire only what the user has specified as the data of interest.

Figure 6:
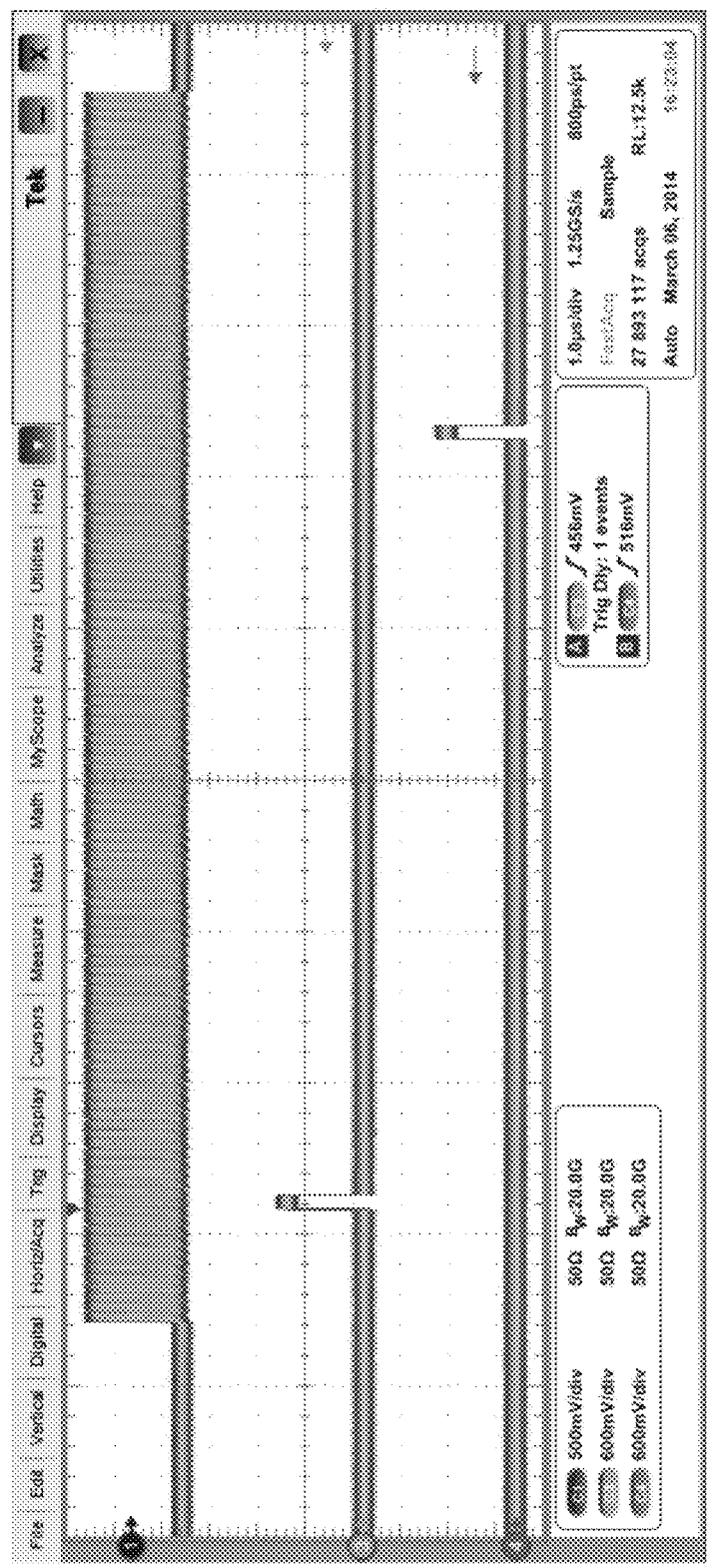
Figure 7:
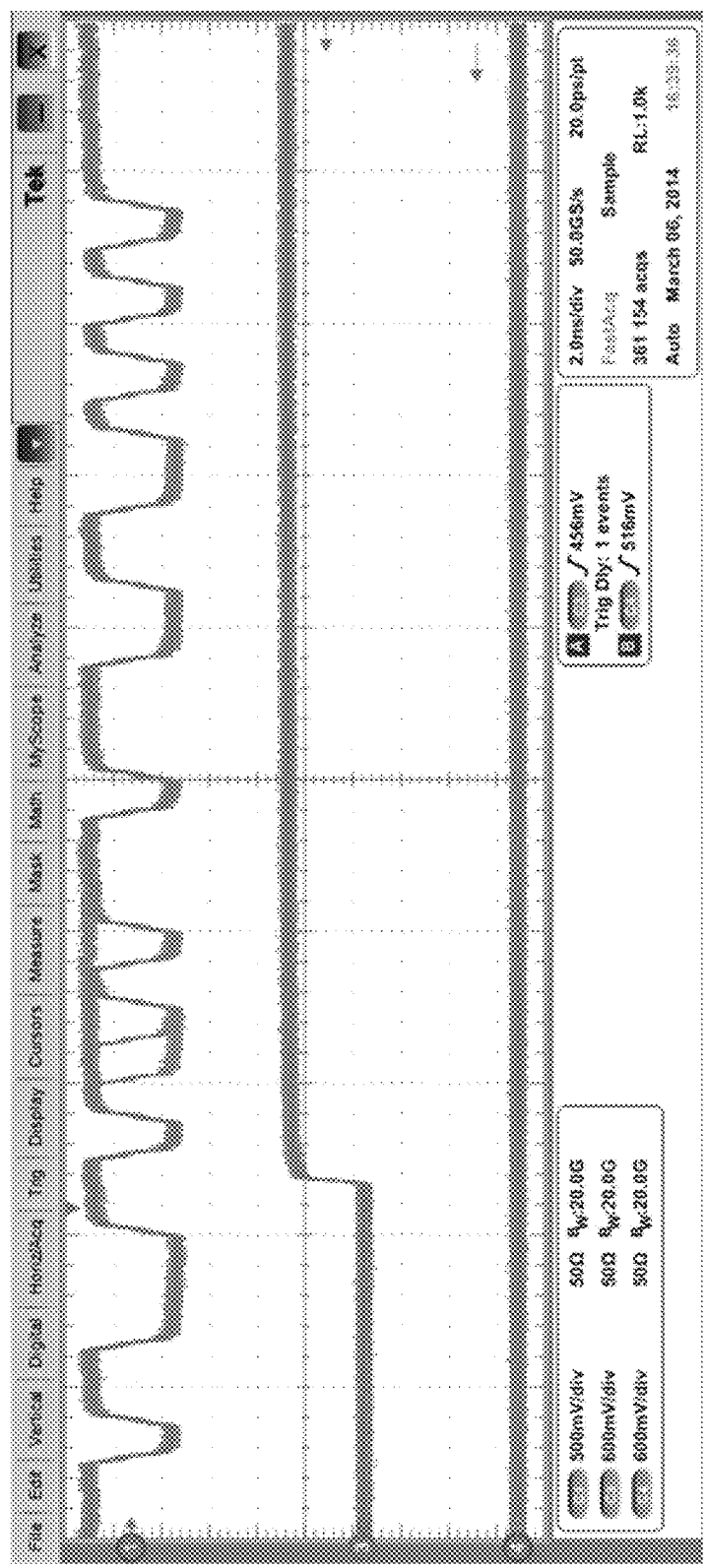

FIG. 6 depicts a screenshot of the advanced triggering mode showing the selection of an A Event on channel 3 validated by a Qualifying B Event on channel 4 5 μs after the A Event. In this instance the qualifying-period timeout is set for 6 μs. FIG. 7 depicts an example screenshot of the selection of an A Event validated by a B Event for a short timebase setting where the qualifying B event occurs after the acquisition has finished. In FIGS. 6 and 7, the A Event is a positive edge on channel 3 and the B Event is a positive edge on channel 4 of the test and measurement instrument. With the qualifying-period timeout value set to 6 μs the channel 1 data no longer shows the pattern where the data stays low for 6 ns because in those instances the validation pulse on channel 4 did not occur before the qualifying-period timeout. Although channels 3 and 4 are shown in FIGS. 6 and 7 for the sake of clarity of explanation, the channels need not be acquired or displayed for proper operation of the advanced trigger sequence. If the channels are not displayed, more digitizing resources are available to capture additional data channels and/or other potential signals of interest.

When the mode is set to an A Event validated by a B Event, only A Events, which are followed by a B event within the timeout period are displayed, as shown in FIGS. 6 and 7. FIG. 7, which depicts the shorter timebase, shows the multiple data patterns present which are accompanied by a subsequent B event within the qualifying period, even though the B event which validates the acquisition occurs well after the end of the acquired data record. That is, the B Event must occur before the end-of-qualification-period signal is received, but does not have to occur in the desired acquisition record.

Figure 8:
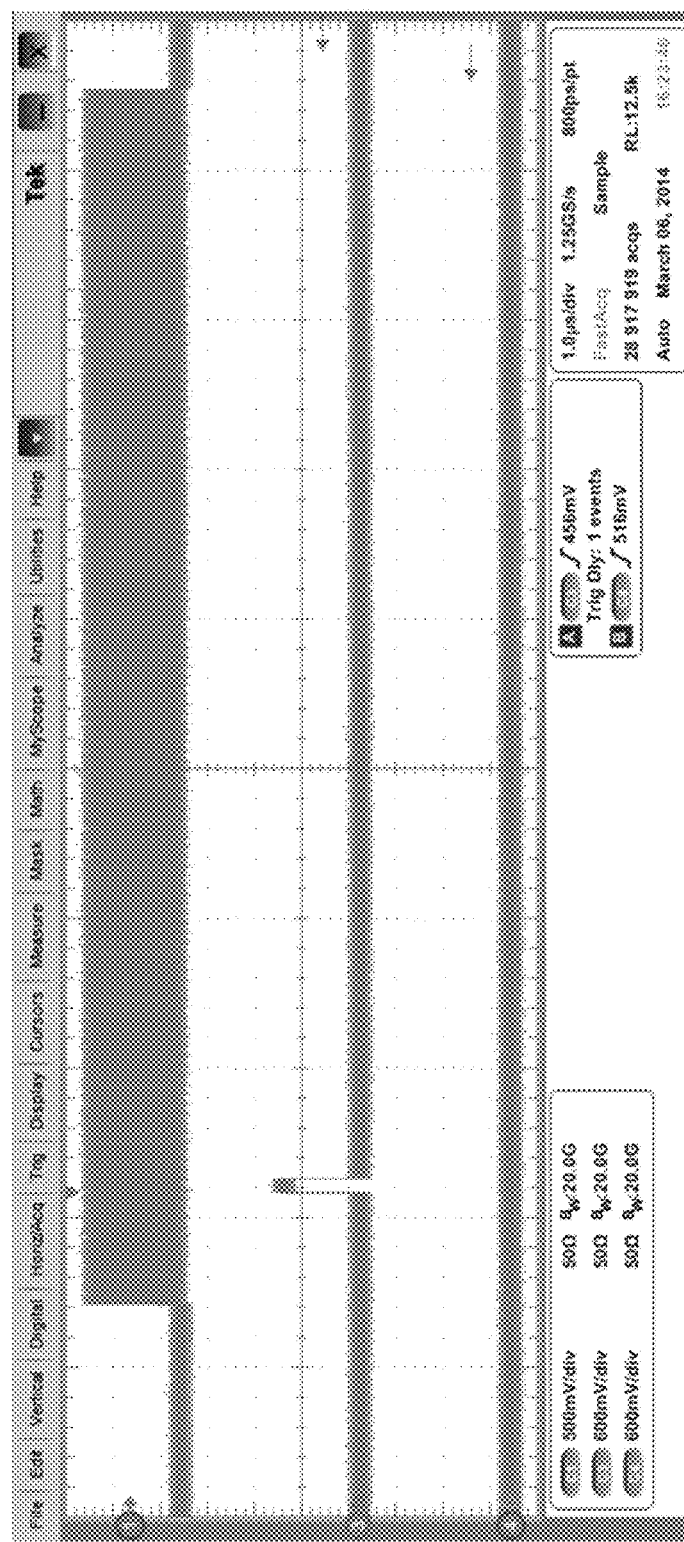
Figure 9:
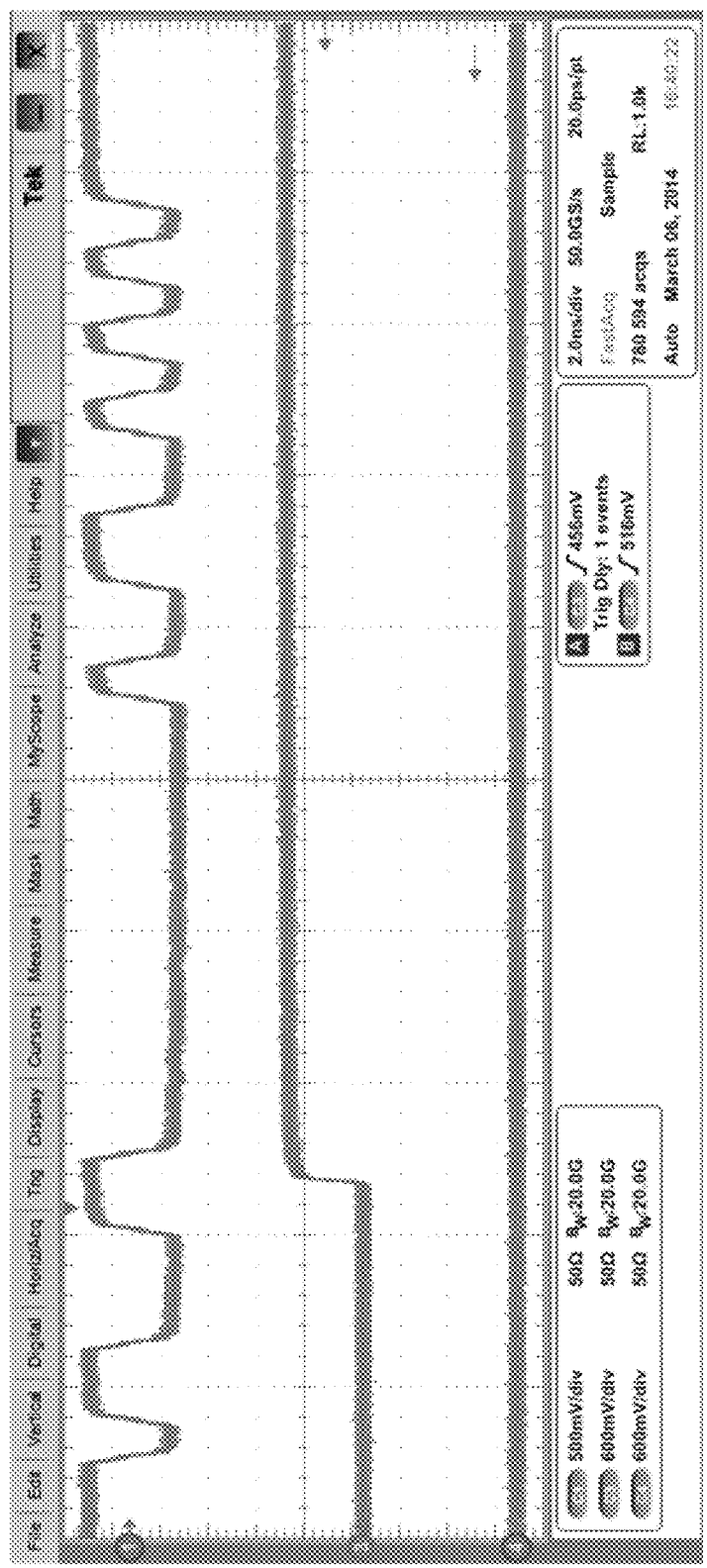

FIGS. 8 and 9 illustrate a second case, where the advanced trigger functionality is set to the A Event invalidated by B Event, as discussed above. FIG. 8 depicts a long timebase setting, while FIG. 9 depicts a short timebase setting. In this mode, only A events which are not followed by a B Event within the qualification period are displayed. FIG. 9 illustrates that only one data pattern is present with a 6 ns low pulse after the channel 3 A Event instances which are not accompanied by a subsequent B Event within the qualification period.

FIGS. 6-9 may represent a series of output test vectors on channel 1 from a device-under-test, for example. Channel 3 may represent a timing reference at a critical part of the test currently under investigation and channel 4 may represent a test failure indication occurring, if at all, at the end of each repetition of the test. If such is the case, FIGS. 6 and 7 represent an overlay of the multiple failed vectors, while FIGS. 8 and 9 represent only the passing vectors.

Preferably, the test and measurement instrument is an oscilloscope. However, the test and measurement instrument may be any analog monitoring real-time instrument.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A test and measurement instrument, comprising:
   an input configured to receive a signal-under-test;
   a user input configured to accept a first trigger event and a second trigger event from a user, and further configured to accept an event validation mode from a user;
   a first trigger decoder configured to trigger on an occurrence of the first trigger event and generate a first trigger signal;
   a second trigger decoder configured to trigger on an occurrence of the second trigger event occurring after the first trigger event and generate a second trigger signal; and
   an acquisition system configured to acquire the signal-under-test in response to the first trigger signal, and to store the acquired signal-under-test based on the event validation mode and whether the second trigger signal is generated by the second trigger decoder.

2. The test and measurement instrument of claim 1, further comprising a timer configured to begin timing a specified time period when the first trigger signal is generated and generate an end-of-time signal when the specified time period ends, wherein the user interface is configured to accept the specified time period from the user.

3. The test and measurement instrument of claim 2, wherein the acquisition system is configured to store the signal-under-test when the acquisition system receives the second trigger signal before the end-of-time signal.

4. The test and measurement instrument of claim 2, wherein the acquisition system is configured to store the signal-under-test when the acquisition system does not receive the second trigger signal before the end-of-time signal.

5. The test and measurement instrument of claim 2, further comprising a reset circuit configured to reset the first trigger decoder when the end-of-time signal is generated.

6. The test and measurement instrument of claim 2, further comprising a reset circuit configured to reset the first trigger decoder if the second trigger signal is generated.

7. The test and measurement instrument of claim 1, wherein the user input further accepts a third trigger event, and the test and measurement instrument further comprises a third trigger decoder configured to trigger on an occurrence of a third trigger event and generate a third trigger signal,
   wherein the acquisition system is further configured to store the acquired signal-under-test based on whether the second trigger signal is generated before the third trigger signal is generated.

8. The test and measurement instrument of claim 1, wherein the first and second trigger decoders are hardware components.

9. The test and measurement instrument of claim 2, wherein the first and second trigger decoders and the timer are hardware components.

10. The test and measurement instrument of claim 7, wherein the first, second, and third trigger decoders are hardware components.

11. The test and measurement instrument of claim 1, wherein the test and measurement instrument is an oscilloscope.

12. A method for triggering an acquisition of a signal-under-test in a test and measurement instrument, the method comprising:
    receiving a signal-under-test;
    receiving a first trigger event and a second trigger event, and an event validation mode;
    triggering on an occurrence of the first trigger event and generating a first trigger signal;
    triggering on an occurrence of the second trigger event occurring after the first trigger event and generating a second trigger signal; and
    acquiring the signal-under-test in response to the first trigger signal and storing the acquired signal-under-test based on the event validation mode and whether the second trigger signal is generated.

13. The method of claim 12, further comprising timing a specified time period from when the first trigger signal is generated and generating an end-of-time signal when the specified time period ends.

14. The method of claim 13, wherein storing the acquired signal-under-test further includes storing the signal-under-test when the acquisition system receives the second trigger signal before the end-of-time signal.

15. The method of claim 13, wherein storing the acquired signal-under-test further includes storing the signal-under-test when the acquisition system does not receive the second trigger signal before the end-of-time signal.

16. The method of claim 12, further comprising:
receiving a third trigger event; and
triggering on an occurrence of the third trigger event and generating a third trigger signal,
wherein the acquired signal-under-test is stored based on whether the second trigger signal is generated before the third trigger signal is generated.

17. The method of claim 12, wherein, when the received event validation mode is a mode in which the occurrence of the second trigger event validates the occurrence of the first trigger event, the acquired signal-under-test is stored if the second trigger signal is generated, and the acquired signal-under-test is discarded if the second trigger signal is not generated.

18. The method of claim 12, wherein, when the received event validation mode is a mode in which the occurrence of the second trigger event invalidates the occurrence of the first trigger event, the acquired signal-under-test is stored if the second trigger signal is not generated, and the acquired signal-under-test is discarded if the second trigger signal is generated.

19. The test and measurement instrument of claim 1, wherein, when the accepted event validation mode is a mode in which the occurrence of the second trigger event validates the occurrence of the first trigger event, the acquisition system stores the acquired signal-under-test if the second trigger signal is generated, and discards the acquired signal-under-test if the second trigger signal is not generated.

20. The test and measurement instrument of claim 1, wherein, when the accepted event validation mode is a mode in which the occurrence of the second trigger event invalidates the occurrence of the first trigger event, the acquisition system stores the acquired signal-under-test if the second trigger signal is not generated, and discards the acquired signal-under-test if the second trigger signal is generated.

* * * * *